United States Patent
Voronin et al.

(10) Patent No.: US 10,818,502 B2
(45) Date of Patent: Oct. 27, 2020

(54) SYSTEM AND METHOD OF PLASMA DISCHARGE IGNITION TO REDUCE SURFACE PARTICLES

(71) Applicant: TOKYO ELECTRON LIMITED, Tokyo (JP)

(72) Inventors: Sergey Voronin, Delmar, NY (US); Jason Marion, Glenville, NY (US); Yusuke Yoshida, Guilderland, NY (US); Alok Ranjan, Mechanicville, NY (US); Takashi Enomoto, Kurokawa-gun (JP); Yoshio Ishikawa, Kurokawa-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 5 days.

(21) Appl. No.: 15/818,273

(22) Filed: Nov. 20, 2017

(65) Prior Publication Data

US 2018/0144946 A1 May 24, 2018

Related U.S. Application Data

(60) Provisional application No. 62/424,791, filed on Nov. 21, 2016.

(51) Int. Cl.
*H01L 21/3065* (2006.01)
*H01J 37/32* (2006.01)
(Continued)

(52) U.S. Cl.
CPC .... *H01L 21/3065* (2013.01); *H01J 37/32082* (2013.01); *H01J 37/32165* (2013.01);
(Continued)

(58) Field of Classification Search
CPC ............. H01L 21/0234; H01L 21/3065; H01L 21/30655; H01L 21/32136; H01L 21/32137
See application file for complete search history.

(56) References Cited

U.S. PATENT DOCUMENTS

| 6,057,244 A | 5/2000 | Hausmann et al. |
| 2003/0151372 A1 | 8/2003 | Tsuchiya et al. |

(Continued)

FOREIGN PATENT DOCUMENTS

| TW | 417230 | 1/2001 |
| TW | 201618225 A | 5/2016 |

(Continued)

OTHER PUBLICATIONS

Office Action dated Sep. 12, 2018 in corresponding Taiwan Patent Application No. 106140217 (with an English translation) (14 pages).
(Continued)

*Primary Examiner* — Thomas T Pham
(74) *Attorney, Agent, or Firm* — Rothwell, Figg, Ernst & Manbeck, P.C.

(57) ABSTRACT

Systems and methods are disclosed for plasma discharge ignition to reduce surface particles and thereby decrease defects introduced during plasma processing. A microelectronic workpiece is positioned on a holder within a process chamber that includes a first radio frequency (RF) power source configured to couple RF power to a top portion of the process chamber, a second RF power source configured to couple RF power to the holder, and a direct current (DC) power supply. Initially, a process gas for plasma process is flowed into the process chamber. The process gas is ignited to form plasma by activating the second RF power source to apply RF power to the holder. Subsequently, the microelectronic workpiece is clamped to the holder by applying the positive voltage to the holder with the DC power supply, and the first RF power source is activated to maintain the plasma within the process chamber.

10 Claims, 4 Drawing Sheets

(51) Int. Cl.
  *H01L 21/67*     (2006.01)
  *H01L 21/683*    (2006.01)
(52) U.S. Cl.
  CPC .. *H01J 37/32697* (2013.01); *H01J 37/32706* (2013.01); *H01L 21/67069* (2013.01); *H01L 21/6831* (2013.01)

(56) References Cited

U.S. PATENT DOCUMENTS

| | | |
|---|---|---|
| 2005/0069651 A1 | 3/2005 | Miyoshi et al. |
| 2008/0068774 A1* | 3/2008 | Sumiya ............. H01J 37/32091 361/235 |
| 2008/0110859 A1* | 5/2008 | Koshiishi .......... H01J 37/32027 216/67 |
| 2012/0152914 A1* | 6/2012 | Matsuura ................ G03F 7/427 219/121.42 |
| 2016/0027620 A1 | 1/2016 | Marion et al. |
| 2017/0186586 A1* | 6/2017 | Oh .................... H01J 37/32128 |

FOREIGN PATENT DOCUMENTS

| | | |
|---|---|---|
| WO | 00/07232 A1 | 2/2000 |
| WO | 02/091461 A2 | 11/2002 |

OTHER PUBLICATIONS

International Search Report and Written Opinion dated Feb. 23, 2018 in PCT/IB2017/057305 (17 pages).

\* cited by examiner

SYSTEM AND METHOD OF PLASMA DISCHARGE IGNITION TO REDUCE SURFACE PARTICLES

RELATED APPLICATIONS

This application claims priority to the following provisional application: U.S. Provisional Patent Application Ser. No. 62/424,791, filed Nov. 21, 2016, and entitled "METHOD OF PLASMA DISCHARGE IGNITION TO REDUCE SURFACE PARTICLES," which is hereby incorporated by reference in its entirety.

BACKGROUND

The present disclosure relates to plasma processing and especially plasma processing systems for semiconductor fabrication.

Plasma processing of microelectronic workpieces, such as semiconductor wafers, is useful for etching materials, depositing films, and conditioning surfaces. A microelectronic workpiece is typically positioned within a vacuum chamber, and then one of various power sources are used to energize or ignited a process gas to create plasma. The plasma is then used for a given process (e.g., deposition, removal, etch, etc.), and then the microelectronic workpiece can continue with additional fabrication steps.

One challenge with operating plasma systems is that of particle contamination. In large scale manufacturing of IC (integrated circuits), this particle contamination can cause problems related to yield loss. Because of this yield loss, there is a large demand within the IC manufacturing industry to ensure plasma etchers and other plasma processing systems do not contribute particles that can cause particle defects to the surface of the microelectronic workpiece during a plasma etch process or other plasma process.

SUMMARY

Systems and related methods are disclosed for plasma discharge ignition to reduce surface particles and thereby decrease defects introduced during plasma processing of microelectronic workpieces. A variety of features and variations can be implemented.

Techniques described herein employ a discharge ignition sequence that reduces surface particle contamination on a given microelectronic workpiece (e.g., wafer) being processed. Embodiments of such techniques do not require hardware modification for many plasma processing systems. Techniques can reduce wafer surface particles for improved yields for integrated circuits (ICs) being manufactured. Embodiments function with systems of various power sources including systems that use microwave surface wave techniques for creating plasma. Processes described herein provide flexibility with power sources and can be used with a variety of types of power sources.

For one embodiment, a method to process a microelectronic workpiece is disclosed including positioning a microelectronic workpiece on a holder within a process chamber where the process chamber includes a first radio frequency (RF) power source configured to couple RF power to the process chamber, a second RF power source configured to couple RF power to the holder, and a direct current (DC) power supply configured to couple a positive voltage to the holder. The method further includes flowing a process gas for a plasma process into the process chamber and igniting the process gas to form plasma by activating the second RF power source such that sufficient RF power is coupled to the holder for plasma ignition. Subsequent to igniting the process gas to form plasma, the method further includes clamping the microelectronic workpiece to the holder by applying the positive voltage to the holder with the DC power supply and activating the first RF power source such that sufficient RF power is coupled to the process chamber to maintain the plasma.

In additional embodiments, the clamping is performed before the activating. In other embodiments, the activating is performed before the clamping.

In additional embodiments, the first RF power source is located in a top portion of the process chamber and the second RF power source is located in a bottom portion of the process chamber. In further embodiments, the second RF power source provides lower RF power to the process chamber than does the first RF power source. In still further embodiments, the igniting includes applying RF power from the second RF power source to a base for the holder.

In additional embodiments, the positive voltage is applied to the holder as at least one of a stair-step voltage change or a ramped voltage. In further embodiments, the method includes using the plasma to perform at least one of an etch of material from a surface of the microelectronic workpiece or a deposit of material on a surface of the microelectronic workpiece.

In additional embodiments, the holder comprises an electrostatic chuck. In further embodiments, the microelectronic workpiece is a semiconductor wafer.

For one embodiment, a system to process microelectronic workpieces is disclosed including a process chamber, a holder for a microelectronic workpiece where the holder is positioned within the process chamber, a first radio frequency (RF) power source configured to apply RF power to the process chamber sufficient to maintain a plasma, a second RF power source configured to couple RF power to the holder sufficient to ignite a process gas to form plasma within the process chamber, a direct current (DC) power supply configured to apply a positive voltage to the holder to electrostatically attract the microelectronic workpiece to the holder, and a controller configured to ignite the process gas by applying RF power with the second RF power source. The controller, subsequent to ignition of the process gas, is further configured to clamp the microelectronic workpiece by applying the positive voltage with the DC power supply and to activate the first RF power source to couple sufficient RF power to the process chamber to maintain the plasma.

In additional embodiments, the controller is configured to clamp the microelectronic workpiece before the first RF power source is activated. In other embodiments, the controller is configured to activate the first RF power source before the microelectronic workpiece is clamped.

In additional embodiments, the first RF power source is located in a top portion of the process chamber and the second RF power source is located in a bottom portion of the process chamber. In further embodiments, the second RF power source is configured to provide lower RF power to the process chamber than the first RF power source is configured to provide. In still further embodiments, the system further includes a base coupled to the holder, and the second RF power source is configured to apply RF power to the base.

In additional embodiments, the DC power supply is configured to apply the positive voltage as at least one of a stair-step voltage change or a ramped voltage. In further embodiments, the plasma is configured to perform at least one of an etch of material from a surface of the microelectronic workpiece or a deposit of material on a surface of the microelectronic workpiece.

In additional embodiments, the holder comprises an electrostatic chuck. In further embodiments, the microelectronic workpiece is a semiconductor wafer.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

It is noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
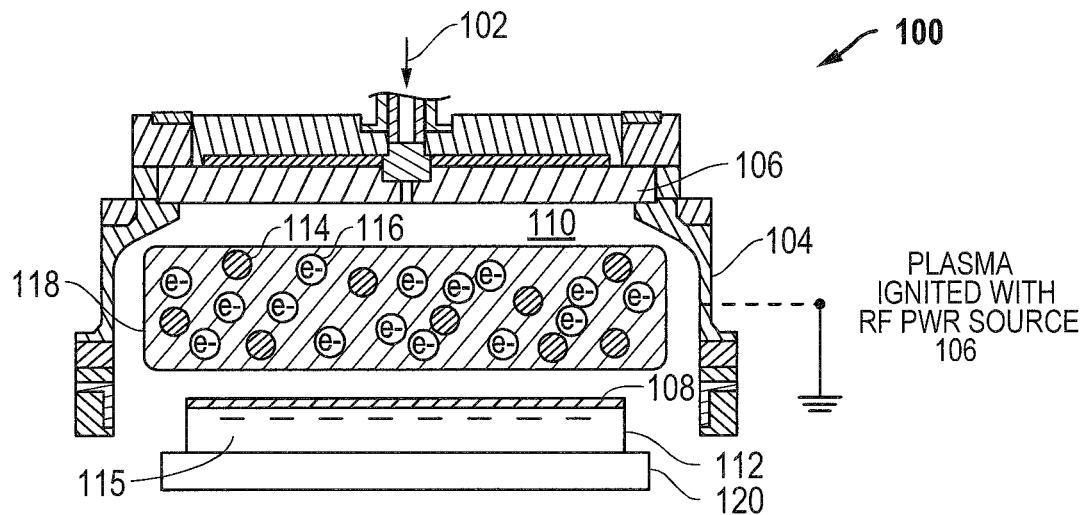
FIG. 1 is a diagram for an example embodiment where process gas is ignited to form plasma within the process chamber by applying a radio frequency power source coupled to a top portion of a process chamber.

Systems and related methods are disclosed for plasma discharge ignition to reduce surface particles and thereby decrease defects introduced during plasma processing of microelectronic workpieces. In addition to the features described herein, additional features and variations can be implemented and related systems and methods can be utilized as well while still taking advantage of the plasma ignition techniques described herein.

As described herein, plasma processing systems, including antenna-based microwave plasma etching systems, can generate relatively large numbers of particles during the plasma ignition sequence. According to the embodiment described herein, it was determined that particle generation is especially prominent during a clamping period when a microelectronic workpiece (e.g., semiconductor wafer or substrate) is electrostatically clamped or chucked to a substrate holder. Initially, these particles are located on the walls of the process chamber and on dielectric plates positioned near the main plasma energy source (e.g., antenna for microwave systems). For plasma ignition, a strong electromagnetic field is applied to the antenna, resulting in an electrical breakdown in the process gas previously injected within the process chamber. Rapid electromagnetic, pressure and temperature perturbations near the plasma energy source and dielectric plate enhance particle removal from the surface of the process chamber into the process gas and the resulting plasma. Due to the high electron mobility of these particles as compared to other ions within the plasma, these particles receive a negative charge. The negatively charged particles can then become trapped in an electrostatic equilibrium at the edge of the plasma sheaths. When a positive voltage is supplied to clamp the microelectronic workpiece (e.g., semiconductor wafer) to the holder (e.g., electrostatic chuck (ESC)), a positive current spike is generated by a flux of both negatively charged particles and electrons toward the surface of the microelectronic workpiece. Consequently, a high number of particles tend to land on the wafer and potentially cause defects that reduce process yields.

To reduce the number of particles introduced into the plasma, embodiments and techniques described herein use a secondary radio frequency (RF) to provide plasma ignition prior to clamping of the microelectronic workpiece (e.g., through ESC chucking). In particular, RF power through an RF voltage is applied to the holder (e.g., electrostatic chuck) to generate smaller electrical fields and physical perturbations near the dielectric plate surface and/or other surfaces within the process chamber. This reduction in electrical field and physical perturbations during plasma ignition reduces the density of particles introduced into the plasma and thereby minimizes the number of resulting defects on the microelectronic workpiece or wafer as compared to prior solutions that use a primary RF power source as a high-power, high-frequency power source for plasma ignition.

Figure 2:
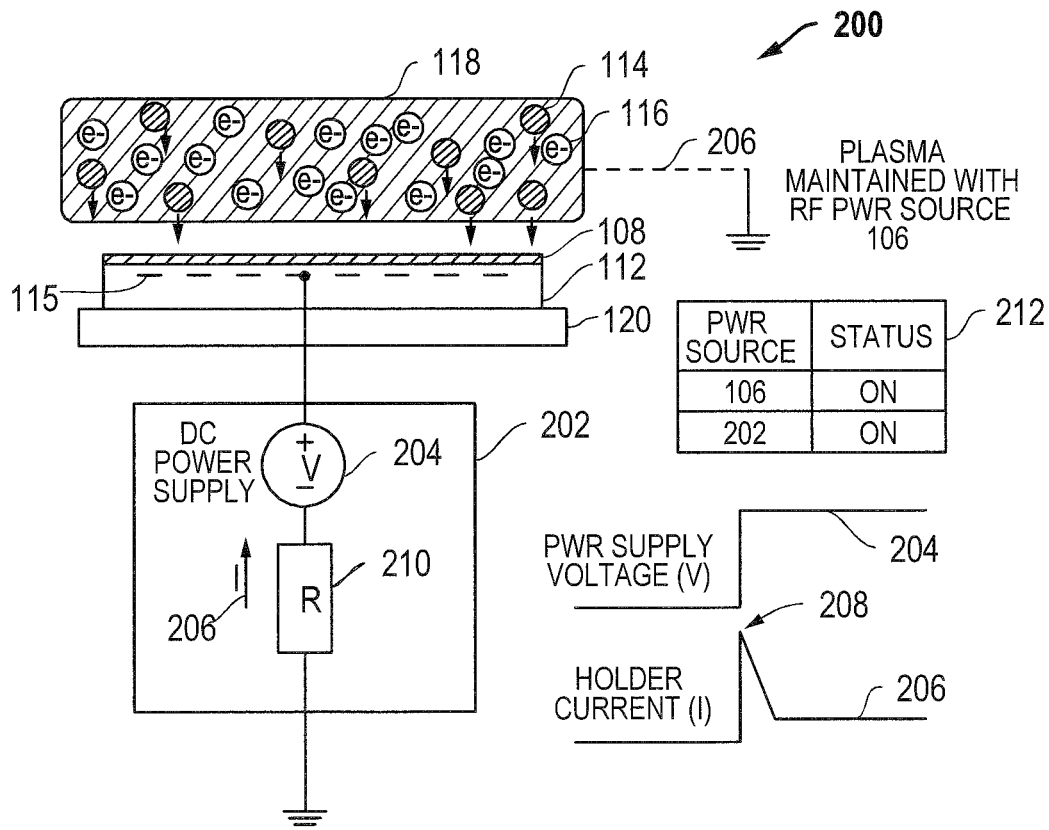
FIG. 2 is a diagram of an example embodiment where a positive voltage is applied to a holder using a direct current power supply to clamp a microelectronic workpiece to the holder.
Figure 3:
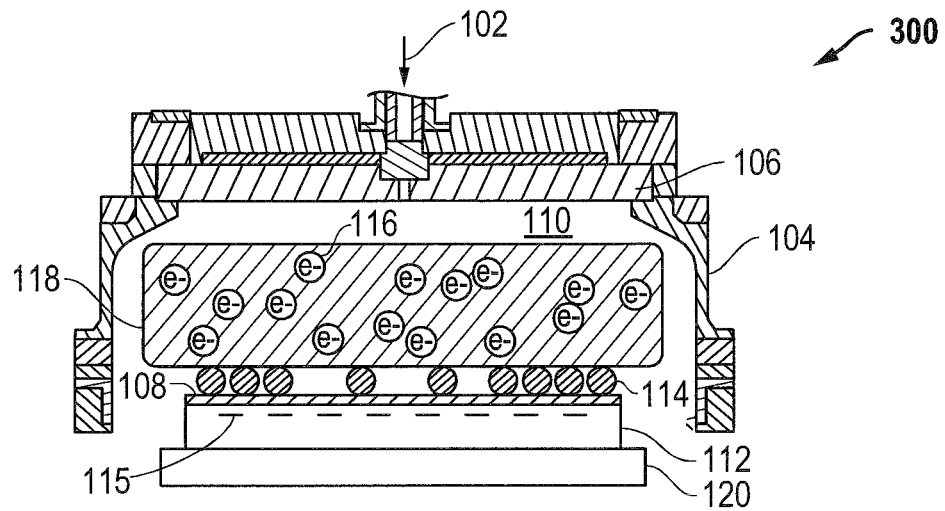
FIG. 3 is a diagram of an example embodiment where particles introduced by the plasma processing system into the plasma have impacted the surface of the microelectronic workpiece and thereby represent potential defects that reduce process yields.

FIGS. 1-3 described below illustrate challenges recognized with respect to source power ignition of plasma 118 using a radio frequency (RF) power source 106 located at the top of a process chamber 104. This plasma ignition process tends to cause large perturbations and electrical fields near a top plate for a process chamber that in turn generate high densities of particles 114 that represent unwanted impurities within the process gas 102 that was previously introduced into the process chamber 104.

Looking first to FIG. 1, a diagram is provided for an example embodiment 100 where the plasma 118 is ignited with the RF power source 106 coupled to the top portion of the process chamber 104. A microelectronic workpiece 108, such as a semiconductor wafer, is positioned within the process chamber on a holder 112, such as an electrostatic chuck (ESC), which includes one or more electrodes 115. For one embodiment, the holder 112 is further positioned on a base 120 for the holder 112, such as a conductive susceptor. The RF power source 106 is used to ignite the process gas 102 to form plasma 118 by applying RF power within the process space 110 within the interior of the process chamber 104. The process gas 102 is previously introduced into the process chamber 104, for example, through one or more orifices within the top portion of the process chamber 104. Particles 114 are released into the process chamber 104 and enter the plasma 118 due to the ignition of the plasma 118 with the RF power source 106. In particular, although some particles 114 are released from the chamber wall (e.g., residual particles), particles 114 are primarily released from the top chamber wall due to high electrical perturbations that tend to cause physical sputtering of the top plate material resulting in generation of large numbers of released particles 114. As such, due to the large perturbations and electrical fields near the chamber wall, the density of the particles 114 can be relatively high within the plasma 118. As described below, these particles 114 become negatively charged due to the high electron mobility of the electrons 116 within the plasma 118 and lead to particle contamination of the microelectronic workpiece 108.

FIG. 2 is a diagram of an example embodiment 200 where a positive voltage 204 is applied to the holder 112 using DC (direct current) power supply 202 to clamp the microelectronic workpiece 108 to the holder 112. For example, a positive voltage 204 from the DC power supply 202 is applied to electrodes 115 within the holder 112, such as an ESC, to cause the microelectronic workpiece 108 to be electrostatically clamped to the holder 112. The application of the positive voltage 204 by the DC power supply 202 to the holder 112 also causes a current spike 208 within the current (I) 206 being supplied to the electrodes 115 within the holder 112. The level for the current spike 208 is mostly limited by a resistance (R) 210, and the current (I) 206 is defined by process cooling water (PCW) conductivity or other sources of circuit current leakage within the system. The current (I) 206 then settles to a nominal level as shown for embodiment 200. The application of the positive voltage (V) 204 along with the current spike 208 tends to pull the particles 114 from plasma 118 towards the surface of the microelectronic workpiece 108. It is noted that chart 212 provides example status conditions for the first RF power source 106 and the DC power supply 202 during the clamping and plasma ignition operations.

FIG. 3 is a diagram of an example embodiment 300 where the particles 114 have impacted the surface of the microelectronic workpiece 108. These particles 114 represent undesired impurities associated with the processing of the microelectronic workpiece 108 using plasma 118. The plasma processing can be, for example, a plasma deposition process that deposits material on the surface of the microelectronic workpiece 108; a plasma etch process that etches material from the surface of the microelectronic workpiece 108; and/or some other plasma process. The defect density caused by particles 114 that impact the surface of the microelectronic workpiece 108 can lead to undesirable yield losses for integrated circuits (ICs) manufactured using the plasma process within process chamber 104.

It has been found that improvements can be achieved in reducing the number of particles 114 that reach the surface and become impurities by ramping the voltage (V) 204 when it is applied to the holder 112. However, the defect density due to these particles 114 being released into the plasma 118 can still lead to unacceptable yield losses even if a ramped voltage is applied.

Figure 4:
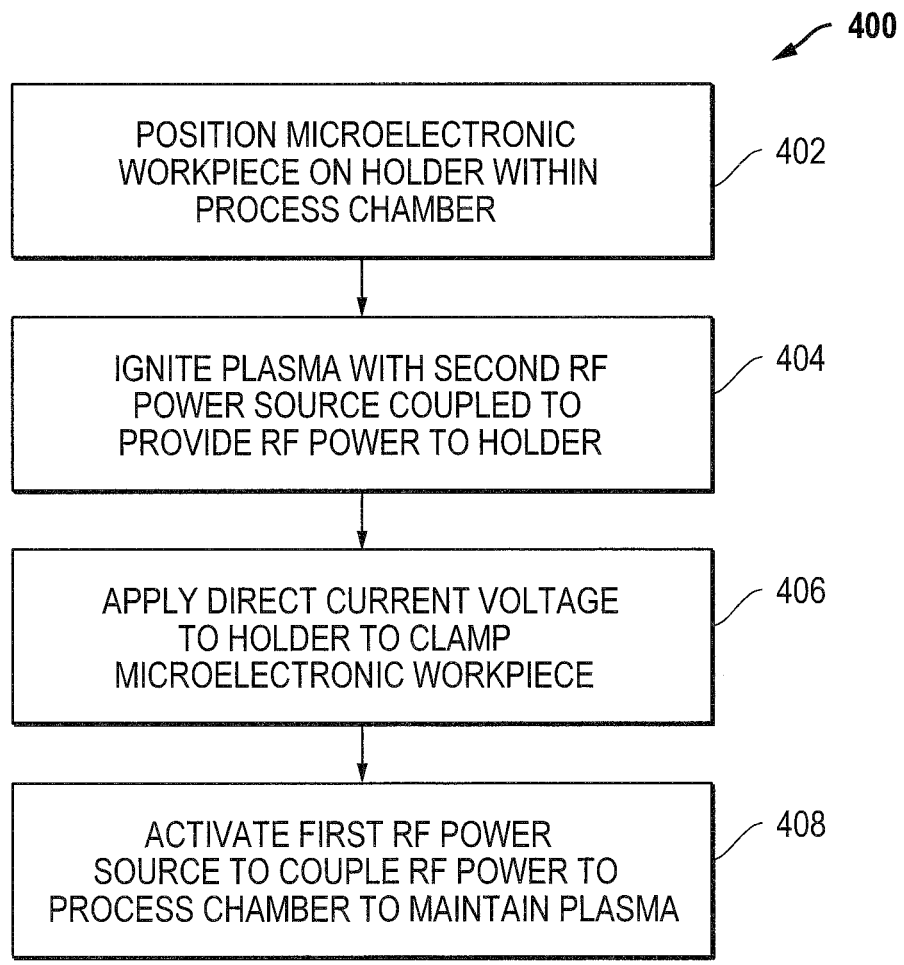
FIG. 4 is a process flow diagram for an example embodiment that uses a second radio frequency power source to provide initial bias power ignition of the process gas such that the number of particles released into the plasma is reduced and process yields are improved.
Figure 5:
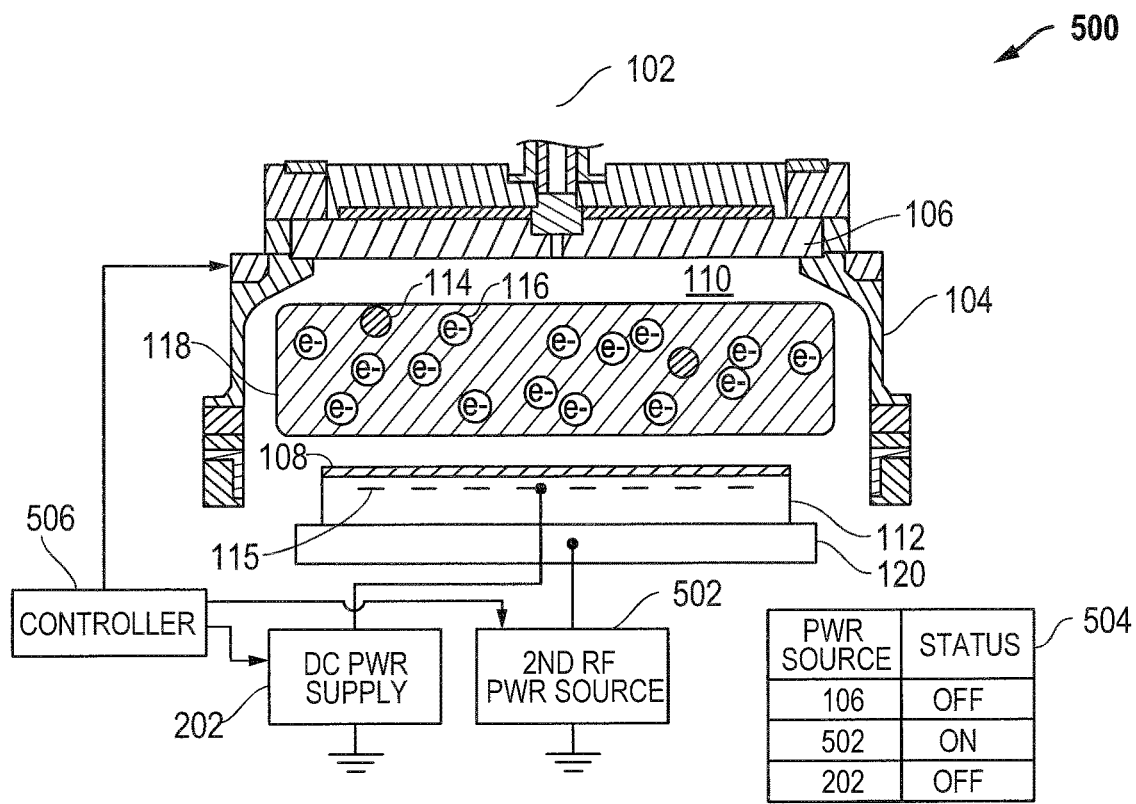
FIG. 5 is a diagram of an example embodiment where the process gas is ignited to form plasma using the second radio frequency power source that is coupled to provide RF power to the process gas through the holder within the process chamber.
Figure 6:
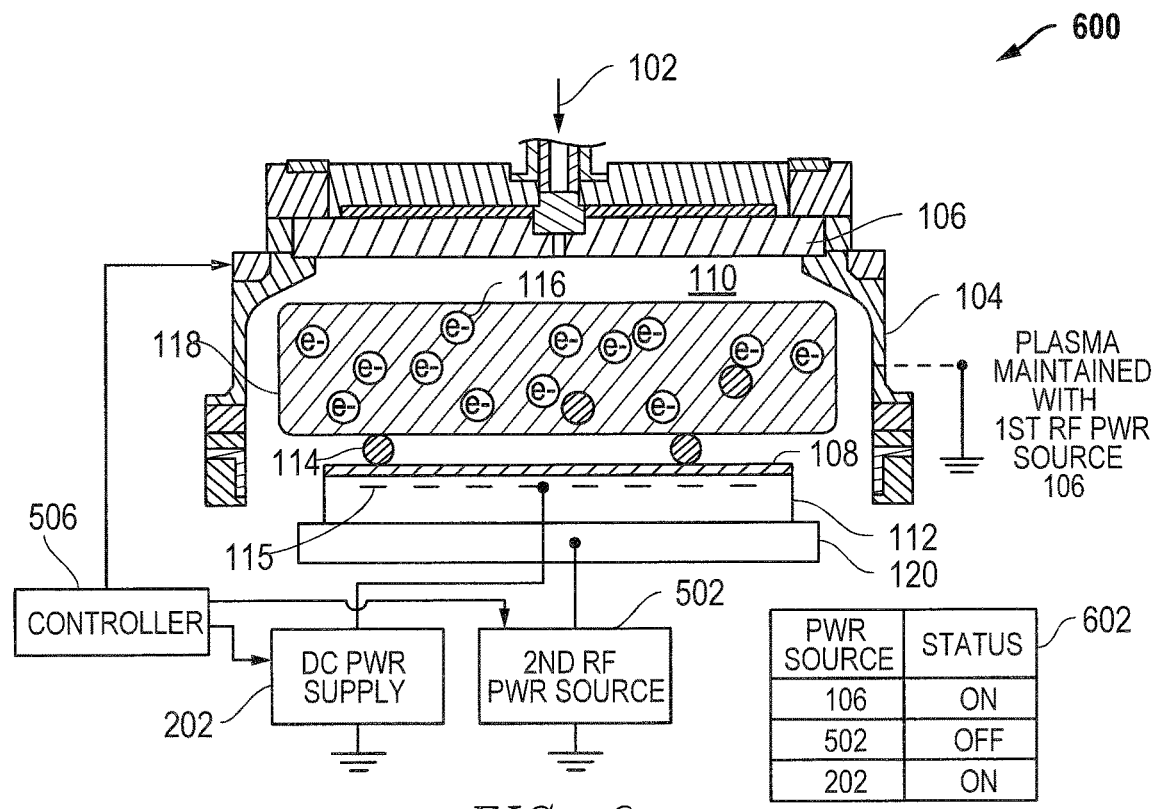
FIG. 6 is a diagram of an example embodiment where a positive voltage is applied to a holder to clamp a microelectronic workpiece and where contamination from particles has been reduced through the use of the second radio frequency power source.

FIGS. 4-6 described below illustrate benefits of bias power ignition using a second RF power source 502 that causes relatively small perturbations and electrical fields near the top plate surface and/or other surfaces within the process chamber 104, thereby resulting in lower densities of particles 114 introduced into the plasma 118 and higher process yields.

Looking first to FIG. 4, a process flow diagram is provided for an example embodiment 400 that uses a second RF power source 502 to provide bias power ignition of plasma 118 that reduces the number of particles 114 released into the plasma 118 and thereby improves process yields. In block 402, a microelectronic workpiece 108 is positioned on a holder 112, such as an ESC, within a process chamber 104. In block 404, plasma ignition is performed with a second RF power source 502 (as shown in FIGS. 5-6) that is coupled at the bottom of the process chamber 104, for example, to the base 120. In block 406, a direct current (DC) positive voltage 204 is applied to electrodes 115 within the holder 112 to clamp the microelectronic workpiece 108. In block 408, plasma 118 is maintained by activating a first RF power source 106 that couples RF power to the process chamber 104. By performing the plasma ignition with the second RF power source 502 coupled at the bottom portion of the process chamber 104, the number of particles 114 entering the plasma 118 is significantly reduced thereby reducing defect densities caused by particles 114.

It is noted that the process steps of FIG. 4 can be controlled by a controller 506 as depicted in FIGS. 5-6 and described below. It is also noted that the controller 506 can be implemented using one or more programmable integrated circuits that are programmed to provide the functionality described herein. For example, one or more processors (e.g., microprocessor, microcontroller, central processing unit, etc.), programmable logic devices (e.g., CPLD (complex programmable logic device), FPGA (field programmable gate array), etc.), and/or other programmable integrated circuits can be programmed with software or other programming instructions to implement the functionality described herein. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

FIG. 5 is a diagram of an example embodiment 500 where the process gas 102 is ignited to form plasma 118 using the second RF power source 502 that is coupled to provide bias power ignition through the holder 112 within the process chamber 104. Initially, a microelectronic workpiece 108, such as a semiconductor wafer, is positioned within the process chamber on a holder 112, such as an electrostatic chuck (ESC). For one embodiment, the holder 112 includes one or more electrodes 115, and the DC power supply 202 is coupled to the electrodes 115. For one embodiment, the holder 112 is further positioned on a base 120, and the second RF power source is coupled to the base 120 to couple RF power through the holder 112 to the process chamber 104. After the process gas 102 is flowed into the process chamber 104, the second RF power source 502 is used to ignite the process gas 102 to form plasma 118, for example, by applying RF power through the holder 112 into the bottom portion of the process chamber 104. The first RF power source 106 is still coupled to introduce RF power to the top portion of the process chamber 104 but is turned off during this bias power ignition provided by the second RF power source 502. The DC power supply 202 is also turned off during this bias power ignition. Some particles 114 may still be released into the process chamber 104 and enter the plasma 118 due to the ignition of the plasma 118 with the second RF power source 502. However, due to smaller perturbations and electrical fields near the chamber wall caused by the use of the second RF power source 502, the density of the particles 114 is relatively low within the plasma 118 as compared to ignition with the first RF power source 106. In one embodiment, a controller 506 is coupled to the first RF power source 106, the DC power supply 202, the second RF power source 502, and/or other components to control the process operations.

It is noted that chart 504 provides example status conditions for the first RF power source 106, the DC power supply 202, and the second RF power source 502 during this initial plasma ignition process. For this initial plasma ignition stage, the RF power applied by the RF power source 502 to the process chamber 104 through the holder 112 is sufficient RF power to ignite the process gas 102 to form the plasma 118. During subsequent operation, the second RF power source 502 can be turned off, or the second RF power source 502 can be used to control the ion energy within the plasma 118, while the first RF power source 106 is used to control the ion density (e.g., ion flux). For typical operation, the output frequency for the first RF power source 106 is higher than the output frequency for the second RF power source 502, although variations can be implemented while still taking advantage of the techniques described here. For one example embodiment, a range for the output frequency of the first RF power source 106 is from about 2 MHz (megahertz) to about 5 GHz (gigahertz) with a maximum output power of less than about 5000 W (Watts), and a range for the output frequency of the second RF power source 502 is from about 400 kHz (kilohertz) to about 40 MHz with a maximum output power of less than about 3000 W. It is further noted that the operating frequency used will typically depend upon the plasma source, such as an inductively coupled plasma (ICP) source, a capacitively coupled plasma (CCP) source, a microwave plasma source, and/or other plasma sources. For example, if an ICP source or CCP source is used, the maximum operating frequency may be kept below about 60-100 MHz. In contrast, if a microwave plasma source is used, an operating frequency range may be kept between 300 MHz to 5 GHz. Other frequency ranges, output power, and related parameters could also be implemented while still taking advantage of the techniques described here.

FIG. 6 is a diagram of an example embodiment 600, which is similar to embodiment 200 of FIG. 2, where a positive voltage (V) 204 is applied to the holder 112 using DC power supply 202. The application of this positive voltage 204 operates to clamp the microelectronic workpiece 108 to the holder 112. For example, a positive voltage 204 from the DC power supply 202 can be applied to electrodes within the holder 112, such as an ESC, to cause the microelectronic workpiece 108 to be electrostatically clamped to the holder 112. In one embodiment, the positive voltage 204 is applied as a stair-step voltage change from an initial zero voltage to the applied bias voltage level that is large enough to cause electrostatic clamping. In one embodiment, the positive voltage 204 is ramped from the initial zero voltage to the applied bias voltage level. Other techniques for applying the positive voltage 204 can also be used. The RF power source 106 is also used to apply RF power to the plasma 118 to maintain the plasma 118 within the process chamber 104. For one embodiment, the clamping performed by applying the positive voltage 204 is performed before the activation of the first RF power source 106. For another embodiment, the first RF power source 106 is activated before the clamping is performed by applying the positive voltage 204. For some embodiments, the second RF power source 502 is not activated during this plasma maintenance operation. However, for other embodiments, the second RF power source 502 is used to control the ion energy within the plasma 118, while the first RF power source 106 is used to control the ion density (e.g., ion flux) in the plasma 118. Other variations could also be implemented while still taking advantage of the techniques described herein.

Because the number and density of particles 114 has been reduced through the bias ignition process using the second RF power source 502 as described herein, the defect density caused by the particles 114 impacting the surface of the microelectronic workpiece 108 is also reduced leading to improved process yields. It is noted that chart 602 provides example status conditions for the first RF power source 106, the DC power supply 202, and the second RF power source 502 during these clamping and plasma maintenance processes. In one embodiment, a controller 506 is coupled to the first RF power source 106, the DC power supply 202, the second RF power source 502, and/or other components to control the process operations.

It is noted that the positive voltage 204 applied by the DC power supply 202 is sufficient to cause enough electrostatic charge to clamp the microelectronic workpiece 108 to the holder 112. It is also noted that the RF power applied by the first RF power source 106 to the process chamber 104 is sufficient to maintain the plasma 118 during the plasma process (e.g., deposition, etch, etc.) performed within the process chamber 104. For one embodiment, the positive voltage 204 for clamping the microelectronic workpiece 108 is within a range from about 100 V (volts) to about 5000 V depending on the design and required clamping conditions for the holder 112, such as an electrostatic chuck. For one embodiment, the RF power applied by the first RF power source 106 to the process gas 102 is configured to maintain the plasma 118 and falls within a range from about 100 W to about 5000 W depending upon the design for the RF power source 106 and the operating conditions (e.g., process gas composition, pressure, etc.) for the plasma process being performed within the process chamber 104.

It is noted that the total charge transfer (I) to the microelectronic workpiece 108 is associated with the number of particles 114 within the plasma 118. In particular, the total negative charge transfer (I) can be represented by the following equation:

$I = e(N+n)/\tau$, where:

e—electron charge;

N—number of particles transferred over the transit time $\tau$; and n—number of electrons transferred over the transit time $\tau$.

It is noted that the number of particles (N) depends upon the initial concentration of particles 114 in the plasma 118 that are available for transit to the microelectronic workpiece 108. As can be seen in the above equation, reducing the particle density in the plasma 118 at a given current (I) will result in smaller number of charge carrier particles (N). This reduction is achieved by implementing the techniques described herein that apply relatively mild ignition conditions through the second RF power source 502 prior to clamping the microelectronic workpiece 108 using the positive voltage 204 applied by the DC power supply 202 and prior to plasma maintenance using the first RF power source 106.

Figure 7:
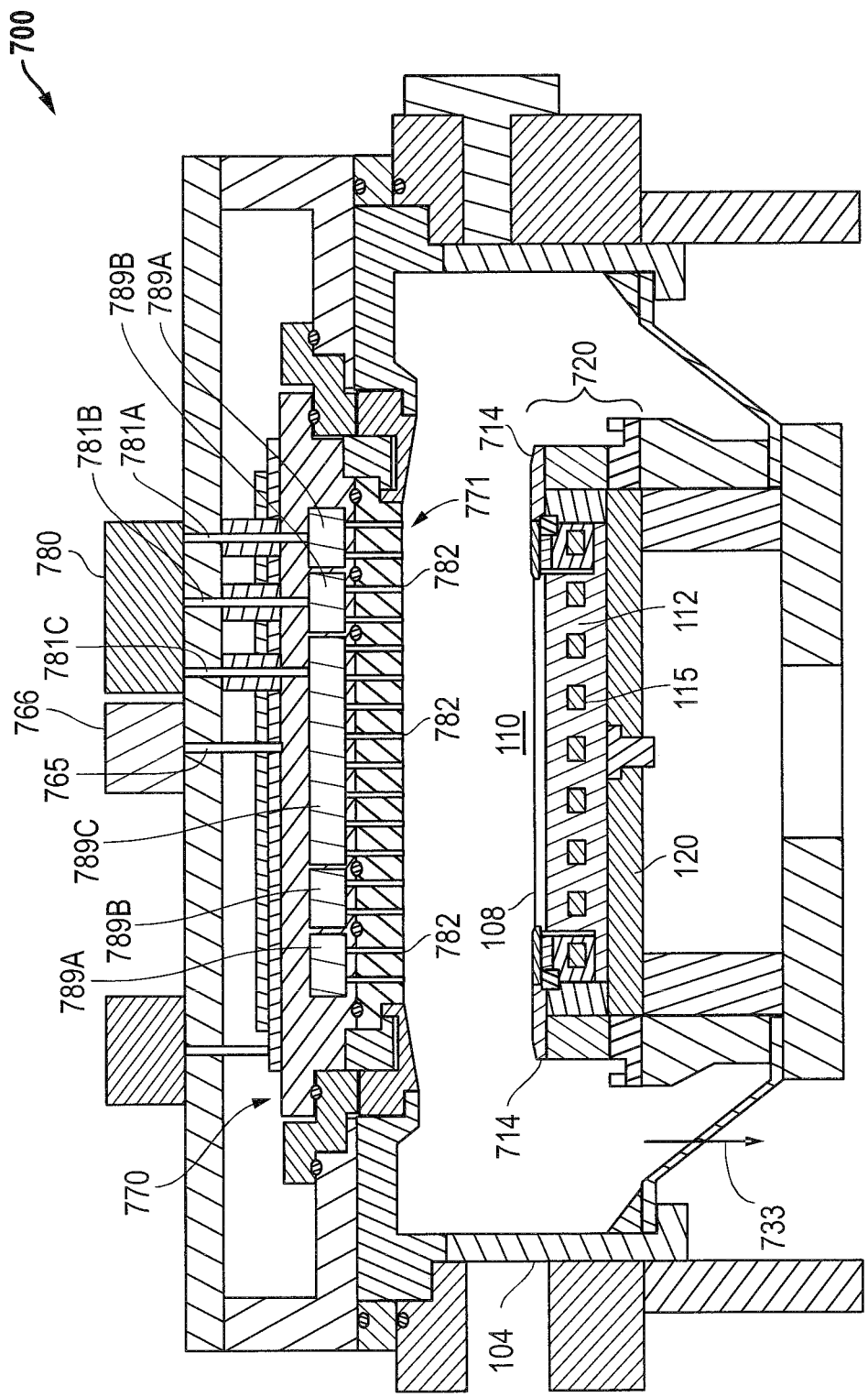
FIG. 7 is a block diagram of an example embodiment for a plasma processing apparatus that can be used for the embodiments described herein.

FIG. 7 is a block diagram of an example embodiment 700 for a plasma processing apparatus for the embodiments described herein. More particularly, FIG. 7 illustrates one example embodiment for a plasma processing apparatus merely for illustrative purposes that can be used to implement the plasma processing techniques described herein. It will be recognized that other plasma processing systems may equally implement the techniques described herein. For the example embodiment 700 of FIG. 7, a schematic cross-sectional view is provided for a capacitively coupled plasma processing apparatus including a process space 110 within the interior of a process chamber 104 for microelectronic workpiece 108. Alternative plasma process apparatus and systems may also be utilized, as desired.

The plasma processing apparatus 700 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 700 is well known, and the particular structure provided herein is merely exemplary. Plasma etch processing can be executed within process chamber 104, which can be a vacuum chamber made of a metal such as aluminum or stainless steel. The process chamber 104 defines a processing vessel providing a process space 110 for plasma generation. An inner wall of the processing vessel can be coated with alumina, yttria, or other protectant. The processing vessel can be cylindrical in shape or have other geometric configurations.

At a lower, central area within the process chamber 104, a base 120 (which is a disc-shaped susceptor for embodiment 700) can serve as a mounting table on which a microelectronic workpiece 108, such as a semiconductor wafer, can be mounted. Microelectronic workpiece 108 can be moved into the process chamber 104 through a loading/unloading port and gate valve. Base 120 forms part of a lower electrode assembly 720 as an example of a second electrode acting as a mounting table for mounting microelectronic workpiece 108 thereon. The base 120 can be formed of, e.g., an aluminum alloy. Base 120 is provided thereon with an electrostatic chuck (as part of the lower electrode assembly) 112 for holding the microelectronic workpiece 108. The electrostatic chuck (ESC) 112 is provided with electrodes 115. Electrodes 115 are electrically connected to direct current (DC) power supply 202. The electrostatic chuck 112 attracts the microelectronic workpiece 108 thereto via an electrostatic force generated when positive voltage 204 from the DC power supply 202 is applied to the electrodes 115. The base 120 can be electrically connected with the second RF power source 502 via a matching unit. For other embodiments and process chambers, two or more power sources can be used and connected to the base 120 and/or other conductive components within the process chamber 104. This second RF power source 502 can output a high-frequency voltage in a range from, for example, 400 kHz to 40 MHz. A focus ring assembly 714 is also provided on an upper surface of the base 120 to surround the electrostatic chuck 112.

An exhaust path 733 can be formed through one or more exhaust ports (not shown) which connect to a gas exhaust unit. The gas exhaust unit can include a vacuum pump such as a turbo molecular pump configured to pump out the plasma processing space within the process chamber 104 to a desired vacuum condition. The gas exhaust unit evacuates the inside of the process chamber 104 thereby depressurizing the inner pressure thereof down to the desired degree of vacuum.

An upper electrode assembly 770 is an example of a first electrode and is positioned vertically above the lower electrode assembly 720 to face the lower electrode assembly 720 in parallel. The plasma generation space or process space 110 is defined between the lower electrode assembly 720 and the upper electrode assembly 770. The upper electrode assembly 770 includes an inner upper electrode 771, having a disk shape, and an outer upper electrode which may be annular and surrounding a periphery of the inner upper electrode 771. The inner upper electrode 771 also functions as a processing gas inlet for injecting a specific amount of processing gas into the process space 110 above microelectronic workpiece 108 mounted on the lower electrode assembly 720. The upper electrode assembly 770 thereby forms a showerhead. More specifically, the inner upper electrode 771 includes gas injection openings 782.

The upper electrode assembly 770 may include one or more buffer chamber(s) 789A, 789B, and 789C. The buffer chambers are used for diffusing process gas and can define a disk-shaped space. A process gas supply system 780 supplies a processing gas to the upper electrode assembly 770. The process gas supply system 780 can be configured to supply a processing gas for performing specific processes, such as film-forming, etching, and the like, on the microelectronic workpiece 108. The process gas supply system 780 is connected to gas supply lines 781A, 781B, and 781C forming a processing gas supply path. The gas supply lines are connected to the buffer chambers of the inner upper electrode 771. The processing gas can then move from the buffer chambers to the gas injection openings 782 at a lower surface thereof. A flow rate of processing gas introduced into the buffer chambers 789A-C can be adjusted by, e.g., by using a mass flow controller. Further, the processing gas introduced is discharged from the gas injection openings 782 of the electrode plate (showerhead electrode) to the process space 110. The inner upper electrode 771 functions in part to provide a showerhead electrode assembly.

As shown in FIG. 7, three buffer chambers 789A, 789B, and 789C are provided corresponding to edge buffer chamber 789A, middle buffer chamber 789B, and center buffer chamber 789C. Similarly, gas supply lines 781A, 781B, and 781C may be configured as edge gas supply line 781A, middle gas supply line 781B and center gas supply line 781C. The buffer chambers are provided in a manner corresponding to different localized regions of the substrate in this case edge, middle and center. These regions may correspond to specific plasma process conditions for localized regions of the microelectronic workpiece 108. It will be recognized that the use of three localized regions is merely exemplary. Thus, the plasma processing apparatus may be configured to provide localized plasma process conditions on any number of regions of the substrate. It is further again noted that any of a variety of configurations may be utilized.

The upper electrode assembly 770 is electrically connected with a high-frequency power source (not shown) (first high-frequency power source) via a power feeder 765 and a matching unit 766. The high-frequency power source can output a high-frequency voltage having a frequency of 40 MHz (megahertz) or higher (e.g., 60 MHz), and/or can output a very high frequency (VHF) voltage having a frequency of 30 MHz to 5 GHz or more. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma process chamber with various microfabrication techniques. In operation, the plasma processing apparatus uses the upper and lower electrodes to generate a plasma in the process space 110 within the interior of the process chamber 104. This generated plasma can then be used for processing a target substrate (such as microelectronic workpiece 108 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

It is further noted that systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to process a microelectronic workpiece, comprising:
  positioning a microelectronic workpiece on a holder within a process chamber, the process chamber including a first radio frequency (RF) power source configured to couple RF power to the process chamber, a second RF power source configured to couple RF power to the holder, and a direct current (DC) power supply configured to couple a positive voltage to the holder;
  flowing a process gas for a plasma process into the process chamber;
  igniting the process gas to form plasma by activating the second RF power source such that sufficient RF power is coupled to the holder for plasma ignition, and wherein during the igniting and while the plasma is initially being formed, the first RF power source does not apply power to the process chamber; and
  subsequent to igniting the process gas to form the plasma, and after the plasma has been formed:
  clamping the microelectronic workpiece to the holder by applying the positive voltage to the holder with the DC power supply; and
  activating the first RF power source such that sufficient RF power is coupled to the process chamber to maintain the plasma.

2. The method of claim 1, wherein the clamping is performed before the activating.

3. The method of claim 1, wherein the activating is performed before the clamping.

4. The method of claim 1, wherein the first RF power source applies power to a location in a top portion of the process chamber and the second RF power source applies power to a location in a bottom portion of the process chamber.

5. The method of claim 1, wherein the second RF power source provides a lower frequency RF power to the process chamber than the first RF power source.

6. The method of claim 1, wherein the igniting comprises applying RF power from the second RF power source to a base for the holder.

7. The method of claim 1, wherein the positive voltage is applied to the holder as at least one of a stair-step voltage change or a ramped voltage, and wherein during the igniting the DC power supply does not apply a voltage to the holder.

8. The method of claim 1, further comprising using the plasma to perform at least one of an etch of material from a surface of the microelectronic workpiece or a deposit of material on a surface of the microelectronic workpiece, and wherein during etching or deposition the plasma is maintained with the first RF power source,
  wherein during at least a portion of the etching or deposition, the second power source does not supply power to the process chamber, and
  wherein during the igniting, the DC power supply does not apply the positive voltage to the holder.

9. The method of claim 8, wherein the holder comprises an electrostatic chuck, wherein the second RF power source applies power to the holder, and the first RF power source applies power to a location in a top portion of the process chamber.

10. The method of claim 1, wherein the microelectronic workpiece is a semiconductor wafer.

* * * * *